United States Patent [19]

Isoda et al.

[11] Patent Number: 5,320,920
[45] Date of Patent: Jun. 14, 1994

[54] METHOD FOR PRODUCING COLOR FILTER COMPRISING AN INORGANIC ACTIVE LAYER AND PHOTORESIST

[75] Inventors: Tenri Isoda; Masahiro Nishida; Takao Hashimoto; Kanji Suyama; Kenji Kishi; Yoshihide Inako; Yosuke Matsukawa, all of Kyoto, Japan

[73] Assignee: Nissha Printing Co., Ltd., Kyoto, Japan

[21] Appl. No.: 543,019

[22] PCT Filed: Jul. 29, 1989

[86] PCT No.: PCT/JP89/00784
§ 371 Date: Dec. 19, 1990
§ 102(e) Date: Dec. 19, 1990

[87] PCT Pub. No.: WO90/01713
PCT Pub. Date: Feb. 22, 1990

[30] Foreign Application Priority Data

Jul. 29, 1988 [JP] Japan .................... 63-191179
Oct. 14, 1988 [JP] Japan .................... 63-259958

[51] Int. Cl.$^5$ ................................... G03F 9/00
[52] U.S. Cl. .......................... 430/7; 430/383; 430/391; 430/505; 430/509
[58] Field of Search ............... 430/7, 383, 391, 505, 430/509

[56] References Cited

U.S. PATENT DOCUMENTS

| | | | |
|---|---|---|---|
| 4,386,144 | 5/1983 | Aono | 430/7 |
| 4,776,671 | 10/1988 | Sumi et al. | 430/7 |
| 4,837,098 | 6/1989 | Shimamura et al. | 430/7 |

Primary Examiner—Steve Rosasco
Attorney, Agent, or Firm—Wenderoth, Lind & Ponack

[57] ABSTRACT

The method for producing a color filter of the present invention comprises the following steps: an inorganic active layer is formed on a transparent substrate, a first color is dyed on said inorganic active layer, a resist is formed on portions of the inorganic active layer other than portions where a second color is dyed, a decoloring treatment is conducted, the second color is dyed on the exposed inorganic active layer, the resist is removed, a resist is formed on portions of the inorganic active layer other than portions where a third color is dyed, a decoloring treatment is conducted, the third color is dyed on the exposed inorganic active layer, and then the resist is removed.

9 Claims, 2 Drawing Sheets

METHOD FOR PRODUCING COLOR FILTER COMPRISING AN INORGANIC ACTIVE LAYER AND PHOTORESIST

FIELD OF THE INVENTION

The present invention relates to a method for efficiently producing a color filter superior in various kinds of physical properties.

BACKGROUND ART

The following color filters have been used for various kinds of displays such as a liquid crystal display.

1. A color filter obtained by forming a polymer film superior in dyeability on a transparent substrate and then patterning the polymer film by photolithography followed by coloring.
2. A color filter obtained by forming a polymer film superior in dyeability on a transparent substrate and then drawing a color filter pattern with dye.
3. A color filter obtained by forming a pigmented polymer film pattern on a transparent substrate by photolithography.
4. A color filter obtained by forming a transparent electroconductive film pattern, e.g. an ITO film pattern, on a transparent substrate and then applying an electrodepositable paint on the transparent electroconductive film.
5. A color filter obtained by forming a colored polymer film on a transparent substrate by a printing method.

However, the above described color filters have the following disadvantages.

The color filter of the method 1 is poor in surface flatness and strength.

The color filter of the method 2 is superior in surface flatness, because the polymer film is not patterned but colored as a color pattern. The filter, however, is poor in surface strength, because it employs polymer material. Also, since the patterns of the respective colors are colored on the same one polymer film, bleeding and migration of the dyes occurs.

Since the color filter of the method 3 is obtained by coloring the polymer film on the transparent substrate in the same manner as the color filter 1, it is poor in surface flatness and surface strength. In addition, a problem may occur in that light is scattered by pigment particles.

In the production of the color filter of the method 4, the patterned transparent electroconductive film has to be formed, and it is further required in many cases that a transparent electrode from ITO and the like is formed on the electrodeposited coat, so that the producing process becomes complicated. In addition, since the electrodepositable paint is applied on the transparent film pattern, the obtained color filter is poor in surface flatness.

The color filter of the method 5 is also poor in surface strength, because it employs polymer material as mentioned in the method 1.

It is an object of the present invention to solve the above described problems and provide a method for efficiently producing a color filter superior in various kinds of physical properties.

DISCLOSURE OF INVENTION

In order to achieve the above described object, the method for producing a color filter of the present invention comprises the following steps: an inorganic active layer is formed on a transparent substrate, a first color is dyed on said inorganic active layer, a resist is formed on portions of the inorganic active layer other than portions where a second color is dyed, a decoloring treatment is conducted, the second color is dyed on the exposed inorganic active layer, the resist is removed, a resist is formed on portions of the inorganic active layer other than portions where a third color is dyed, a decoloring treatment is conducted, the third color is dyed on the exposed inorganic active layer, and then the resist is removed.

BRIEF DESCRIPTION OF DRAWINGS

FIGS. 1(a–j) and 2(a–m) are sectional views showing the manufacturing process of the color filter according to the present invention.

BEST MODE FOR CARRYING OUT THE INVENTION

The present invention is described in more detail with reference to the drawings.

In FIGS. 1(a–j) and 2(a–m), the numeral 1 designates a transparent substrate, the numeral 2 designates an inorganic active layer and the numeral 3 designates a resist.

At first, the inorganic active layer 2 is formed on a surface of the transparent substrate 1 [see FIG. 1 (a)].

Figure 1A:
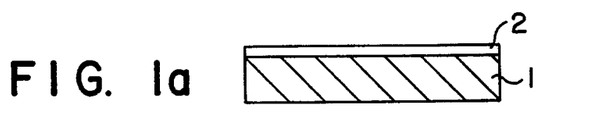

The transparent substrate 1 may be formed from materials used for various kinds of displays (e.g. a liquid crystal display), for example a glass plate, a synthetic resin plate or a synthetic resin film. It is preferable that the glass plate is formed of transparent glass, such as soda-lime glass, aluminosilicate glass, boron silicate glass, barium borosilicate glass and the like.

On the transparent substrate 1, an inorganic active layer 2 prepared from porous inorganic substances is formed. The following sol-gel method is suitable for a method of forming the inorganic active layer 2. Thus, a sol is obtained by hydrolyzing in an aqueous medium a compound expressed by the following formula;

$$M(OR_1)_m(OR_2)_nX_pY_q \qquad (I)$$

wherein M is at least one element selected form the group consisting of magnesium, calcium, zirconium, titanium, hafnium, germanium, yttrium, aluminum, gallium, tin and silicon; $R_1$ and $R_2$, which are the same or different, show a hydrogen atom, an alkyl group or an acyl group, respectively; X and Y, which are the same or different, show a hydrogen atom, a chlorine atom or a hydroxyl group, respectively; m, n, p and q are an integer of 0 to 8, respectively, so as to meet $m+n+p+q=$ a valence of M;

and then degelatinizing. The obtained sol is applied onto the transparent substrate 1 and baked. The compounds expressed by the general formula (I) include tetraethyl silicate, aluminum tri-isopropoxide, titanium tetrabutoxide, zirconium tetrabutoxide, a partially hydrolyzed product thereof and the like. The aqueous medium contains a necessary quantity of water, catalyst for the hydrolysis (such as hydrochloric acid, sulfuric acid, nitric acid and acetic acid) and alcohol. The method of applying the sol to the surface of the transparent substrate 1 includes a bar coating method, a roll coating method, a spin coating method, a dipping method and the like. The above described sol is applied onto the surface of the transparent substrate 1 and then dried followed by baking at temperatures of 300° to 600° C., whereby obtaining an inorganic active layer 2. It is preferable that a thickness of the inorganic active layer 2 is about 1 to 20 μm.

Figure 1B:
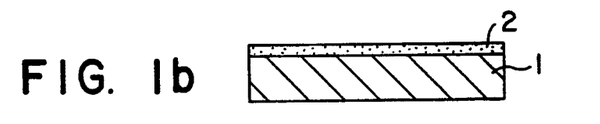

Next, the inorganic active layer 2 is dyed in a first color with a dye [see FIG. 1(b)]. It is preferable that acid dye, acid mordant dye, dye for aluminum, direct dye, oil-soluble dyes and the like are used as the dye. The color to be dyed may be red (R), green (G) or blue (B) for a color filter. Here, red (R) is selected for convenience.

Figure 1C:
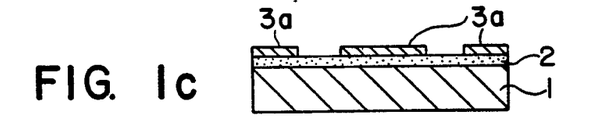

Subsequently, a resist 3a is formed on portions other than portions which are colored with a second color [see FIG. 1(c)]. If the second color is green, the portions to be covered with the resist 3a would be portions which are not colored with green (G). The resist is formed in the desired pattern of the color filter. In addition, it is preferable that a suitable resist, such as photoresist and printing resist, is used depending upon the accuracy of the pattern, cost and the like.

Figure 1D:
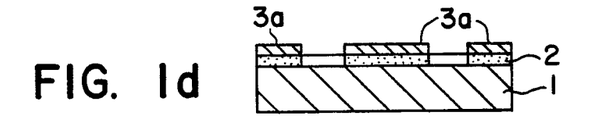

Next, the dye on portions which are not covered with the resist 3a is decolored [refer to FIG. 1(d)]. It is preferable that nitric acid, sodium hypochlorite, sulfuric acid or the like are used for the decoloring treatment. The inorganic active layer 2 on the portions which are not covered with the resist 3a became transparent again by the decoloring treatment and merely the portions which have been covered with the resist are colored in red (R).

Figure 1E:
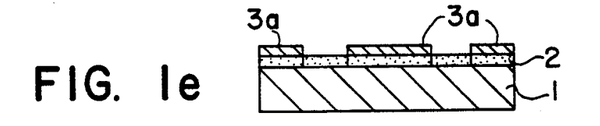

Further, the inorganic active layer 2 is dyed in the second color [refer to FIG. 1(e)]. Here, green (G) is selected as the second color. Since the portions which have been dyed with red (R) in the previous coloring step are covered with the resist 3a, portions other than the resist covered portions are dyed in green (G).

Figure 1F:
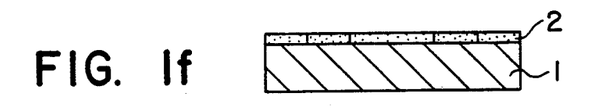
Figure 1G:
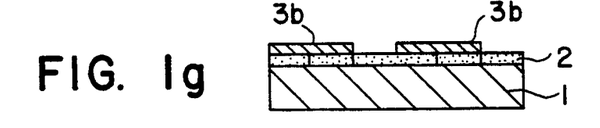

Successively, the resist 3a is removed [see FIG. 1(f)].

Next, a resist 3b is formed on portions other than portions which are to be dyed in a third color, as described above [see FIG. 1(g)]. If the third color is blue, the portions to be covered with the resist 3b would be portions which are not colored with blue (B).

Figure 1H:
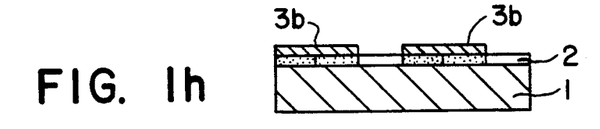

Next, the dye on portions which have not been covered with the resist 3b is decolored [see FIG. 1(h)]. The portions which have not been covered with the resist 3b but dyed in the first color, i.e. red (R), of the inorganic active layer 2 become transparent again.

Figure 1I:
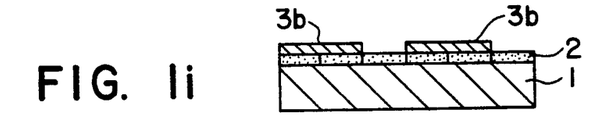

Successively, similar processes are repeated to dye the inorganic active layer 2 by the third color, that is blue (B), [see FIG. 1(i)].

Figure 1J:
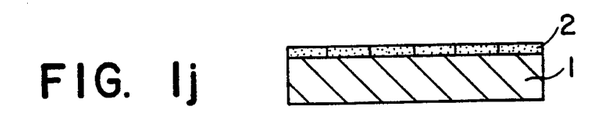

Finally, the resist 3b is removed to obtain the color filter [see FIG. 1(j)].

In the case where the color filter of three colors, that is R, G and B, is produced by the above described method, the patterning is required in only two times of dyeing in green (G) and blue (B), but the patterning, such as formation of resist, masking and etching, is not required in the dyeing in red (R). Moreover, since the dye to be decolored in the above steps is the dye of the first color (i.e. red (R)), it is preferred that a dye which is easily decolored is used as the first color to ensure the reliability of decoloring.

In the case where a black mask is required for the color filter, it can be formed by a chemical plating method or a dyeing method. The process for forming the black mask may be conducted either before any one of the dyeing steps of the first to third colors or after any one of the dyeing steps of the first to third colors. In particular, it is preferred that the black mask is formed after dyeing the first color followed by dyeing the second and third colors, because the black mask can be utilized as an alignment mark when dyeing the second and third colors. For convenience, in the present specification, the black mask is formed by the chemical plating method after the dyeing step of the third color.

Figure 2A:
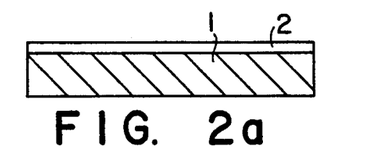
Figure 2B:
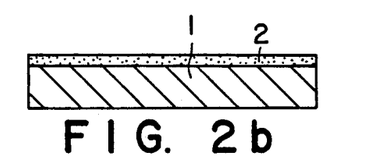

At first, an inorganic active layer 2 is formed on a transparent substrate 1 [see FIG. 2(a)] and colored with a first color [see FIG. 2(b)].

Figure 2C:
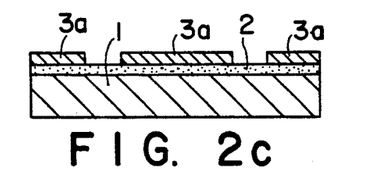

Next, a resist 3a is formed on portions other than portions which are to be colored with a second color [see FIG. 2(c)]. In this time, the resist 3a is also formed on portions on which a black mask is to be formed.

Figure 2D:
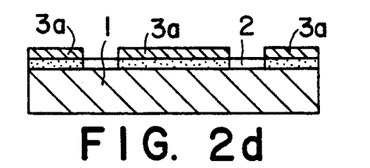
Figure 2E:
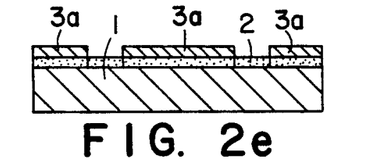
Figure 2F:
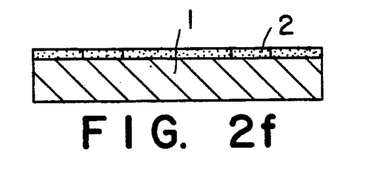

Subsequently, after a decoloring treatment is conducted [see FIG. 2(d)], the exposed inorganic active layer 2 is colored with the second color [see FIG. 2(e)], and the resist 3a is then removed [see FIG. 2(f)].

Figure 2G:
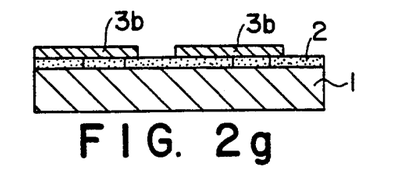

A resist 3b is then formed on portions other than portions which are to be colored with a third color [see FIG. 2(g)]. In this time, the resist 3b is also formed on portions on which the black mask is to be formed.

Figure 2H:
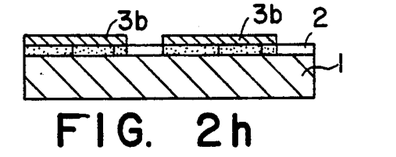
Figure 2I:
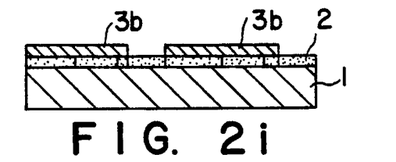
Figure 2J:
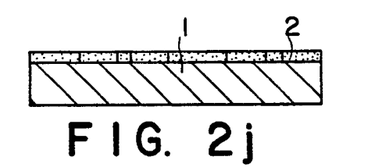

After conducting a decoloring treatment [see FIG. 2(h)], the exposed inorganic active layer 2 is colored with the third color [see FIG. 2(i)] and the resist 3b is removed [see FIG. 2(j)].

Figure 2K:
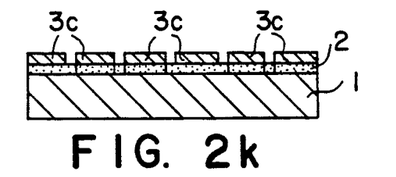

Next, a resist 3c is formed on portions other than portions on which the black mask is to be formed [see FIG. 2(k)].

A decoloring treatment is conducted to only decolor the portions on which the black mask is to be formed, because the portions which have been colored with other three colors of R, G and B are covered with the resist 3c.

Figure 2L:
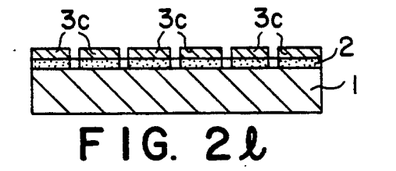

Next, the transparent substrate 1 is subjected to the chemical plating to form the black mask between the respective colors of R, G and B [see FIG. 2(l)].

It is preferable that the chemical plating is conducted by the use of metals more noble than copper. The metals more noble than copper include gold, silver, palladium, platinum, rhodium and ruthenium. The reason why the metals more noble than copper are used is that the portions having a metallic gloss are easily removed after plating and the ground portions exhibit a chemical concentration of 3.0 or more after said portions having a metallic gloss are removed.

The chemical plating can be conducted by the use of the conventional methods. For example, according to the "Electroless Plating" (written by Tokuzo Kanbe), a mixture of the following solution 1 and solution 2 in a ratio of 1:1 can be used as a silver plating bath.

| The solution 1: | |
|---|---|
| Silver nitrate | 20 g |
| Ammonia water | suitable quantity |
| Water | 1,000 ml |
| The solution 2: | |
| Sodium potassium tartarate | 100 g/300 ml |
| Water | to 700 ml in all |

The transparent substrate 1, which has been colored in 3 colors of R, G and B, is immersed in the above described silver plating bath for 30 seconds to 5 minutes and then pulled up from the bath followed by removing the portions having metallic gloss, whereby the black mask can be chemically plated merely between the portions dyed in the respective colors of the color filter.

The portions having metallic gloss deposited on the surface of the inorganic active layer 2 are wiped off by the use of soft substances, such as cloth, paper and rubber spatula, in order to remove the portions having metallic gloss. Merely the portions having metallic gloss are removed by this operation and the black portions, which have been contained in the inorganic active layer 2, remain as they are. The black mask formed in this manner is completely black as seen from either side of the transparent substrate and does not exhibit metallic gloss at all, which is optimum for the black mask. In addition, the section of the obtained black mask was investigated by an optical microscope with the result that black color spread itself from the surface of the inorganic active layer 2 to the deepest portion of the inorganic active layer 2, that is the boundary surface of the inorganic active layer 2 and the transparent substrate 1.

Figure 2M:
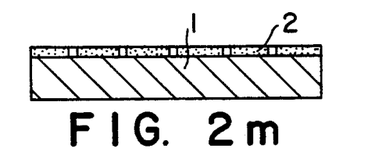

Finally, the resist 3c is removed to obtain the color filter with the black mask formed thereon [see FIG. 2(m)].

The black mask may be formed by a nickel plating method using a palladium-tin catalyst in place of the above described silver plating method. In the nickel plating method, the following steps are conducted in the recited order.

(1) A step of forming the resist on the portions other than the portions on which the black mask is to be formed.

(In the case where the inorganic active layer has been dyed, a step of decoloring)

(2) A step of absorbing a catalyst solution into the inorganic active layer.

(3) A step of activating the catalyst solution.

(4) A step of plating metal.

(5) A step of removing the resist.

Thus, the metals are plated merely on the portions into which the activated catalyst solution has been absorbed. The step (5) of removing the resist in this process may be conducted immediately after the step (2) of absorbing the catalyst solution into the inorganic active layer. In this method, plating can be conducted even without decoloring the inorganic active layer 2 on the portions on which the black mask is to be formed. In addition, in this method, no practical trouble comes up even though the portions having metallic gloss are not removed.

Finally, the resist 3c is removed to obtain the color filter with the black mask formed thereon.

Instead of the chemical plating method, the black mask may be formed by dyeing between the portions which have been dyed in the respective colors of R, G and B, in black. Besides, in order to form the black mask by the dyeing method, at first the black mask may be formed and thereafter colored in colors of R, G and B. In short, according to the dyeing method, four colors of R, G, B and black can be dyed in any order by repeating the process comprising the steps of dyeing, the steps of forming the resist and the step of decoloring.

As described above, in the case where the black mask is formed by the chemical plating method or the dyeing method, the patterning by the resist is conducted merely 3 times, that is, the number of the steps can be reduced.

In the above described processes, the step of forming the resist and the step of decoloring are separately conducted. However, in a certain specified case where the resist is a photoresist capable of being developed by an alkaline developer and the dye of the first color is decomposed or extinguished by alkali, the portions which have been colored with the first color are decolored at the same time as the development of the resist by alkali. In other words, since the treatment by separate two steps can be conducted in one step, the number of the steps can be reduced and thus the process becomes convenient. Such alkaline developer includes sodium hydroxide, potassium hydroxide and other alkaline developers on the market. In this embodiment, it is necessary that the dye of the first color can be decomposed or extinguished by alkali, but it is not necessary that the dyes of other colors and the black mask are decomposed or extinguished by alkali.

An overcoat layer may be formed on the inorganic active layer 2 which has been colored, if necessary. The overcoat layer can be prepared from hard and transparent resins, such as acrylic resins, melamine resins, epoxy resins, silicon resins, unsaturated polyester resins, isocyanate resins, polyimide, polysiloxanes and ultraviolet curable resins. Also, inorganic materials, such as lithium silicate and sodium silicate, may be coated.

Instead of forming the overcoat layer, the transparent substrate which has been dyed may be immersed in an aqueous solution of nickel acetate and the like and then dried and heated to lose the activity of the inorganic active layer, whereby fixing the dye to the inorganic active layer 2.

The above described order of the dyeing of the respective colors of R, G and B is merely illustrative and the order of the dyeing of the respective colors of R, G and B is not especially limited.

PREFERRED EXAMPLES

Example 1

An alumina layer 5 to 10 $\mu$m thick was formed on a transparent glass substrate 1.1 mm thick by the sol-gel method.

Then, the substrate was immersed in a bath of a blue dye C.I. Acid Blue 112 at about 60° C. for about 10 minutes to dye all over the surface of the alumina layer in blue and washed followed by drying.

Next, a photoresist was formed on the portions other than the portions which were to be dyed in green, and the substrate was immersed in 30%-nitric acid for 30 seconds at room temperature to decolor the blue dye on the portions which were not covered with the photoresist.

Subsequently, the substrate was immersed in a bath of a green dye C. I. Acid Green 41 at about 40° C. for about 10 minutes to dye the portions which had been decolored in green and then washed and dried followed by removing the photoresist with acetone.

A photoresist was then formed on the portions other than the portions which were to be dyed in red, and the substrate was immersed in 30%-nitric acid for 30 seconds at room temperature to decolor the blue dye on the portions which were not covered with the photoresist, of the alumina layer.

The substrate was immersed in a bath of a red dye C.I. Acid Red 13 at about 40° C. for about 10 minutes to dye the portions, which had been decolored, of the alumina layer in red and then washed and dried.

Next, after the photoresist had been removed with acetone, a thermosetting melamine resin was coated in a thickness of 0.5 to 1.0 μm to form an overcoat layer, whereby finishing the color filter.

Example 2

The alumina layer was formed on a transparent glass substrate and dyed in the respective colors of B, G and R in the same manner as in EXAMPLE 1.

A photoresist was then formed on the portions other than the portions on which the black mask was to be formed, and the substrate was immersed in 30%-nitric acid at room temperature to decolor the dye on the portions, which had not been covered with the photoresist, of the alumina layer.

Next, the transparent glass substrate was immersed in a mixture solution comprising a solution mixture of the following solutions 1 and 2 in a ratio of 1:1 for 2 minutes to form a black mask on the portions, which had been decolored, of the alumina layer. Subsequently, the portions having a metallic gloss were wiped off with cloth and then washed and dried.

| Solution 1: | |
|---|---|
| Silver nitrate | 20 g |
| Ammonia water | Suitable quantity |
| Water | 1,000 ml |
| Solution 2: | |
| Sodium potassium tartarate | 100 g/300 ml |
| Water | Until 700 ml in all |

Next, after the photoresist was removed with acetone, a thermosetting melamine resin was coated in a thickness of 0.5 to 1.0 μm to form an overcoat layer, whereby finishing the color filter.

Example 3

An alumina layer was formed on a transparent glass substrate and dyed in the respective colors of B, G and R to decolor the dye on the portions on which the black mask was to be formed, as described in Example 2.

Next, the substrate was immersed in a bath of a black dye C.I. Acid Black 107 at 40° C. for about 30 minutes to dye the portions, which had been decolored, of the alumina layer in black and washed followed by drying.

After the photoresist was removed with acetone, a thermosetting melamine resin was coated in a thickness of 0.5 to 1.0 μm to form the overcoat layer, whereby finishing the color filter.

Example 4

An alumina layer 5 to 10 μm thick was formed on the transparent glass substrate 1.1 mm thick by the sol-gel method.

The substrate was then immersed in a bath of a blue dye C.I. Acid Blue 112 at about 60° C. for about 10 minutes to dye all over the surface of the alumina layer in blue and washed followed by drying.

Next, the photoresist was formed on the portions other than the portions on which the black mask was to be formed, and the substrate was immersed in 30%-nitric acid for 30 seconds to room temperature to decolor the blue dye on the portions, which had not been covered with the photoresist, of the alumina layer.

Subsequently, the substrate was immersed in a bath of a black dye (C.I. Mordant Black 9) at about 70° C. for about 30 minutes to dye the portions, which had been decolored, of the alumina layer in black and then washed and dried followed by removing the photoresist with acetone to form the black mask.

A photoresist was formed on the portions other than the portions which were to be dyed in green, and the substrate was immersed in 30%-nitric acid for 30 seconds at room temperature to decolor the blue dye on the portions, which had not been covered with the photoresist, of the alumina layer.

The substrate was then immersed in a bath of a green dye C.I. Acid Green 41 at about 40° C. for about 10 minutes to dye the portions, which had been decolor, of the alumina layer in green and then washed and dried followed by removing the photoresist with acetone.

Next, a photoresist was formed on the portions other than the portions which were to be dyed in red and the substrate was immersed in 30%-nitric acid for 30 seconds at room temperature to decolor the blue dye on the portions, which had not been covered with the photoresist, of the alumina layer.

Successively, the substrate was immersed in a bath of a red dye C.I. Acid Red 13 at about 40° C. for about 10 minutes to dye the portions, which had been decolored, of the alumina layer in red and then washed followed by drying.

Next, after the photoresist had been removed with acetone, a thermosetting melamine resin was coated in a thickness of 0.5 to 1.0 μm to form the overcoat layer, whereby finishing the color filter.

Example 5

An alumina layer was formed on the transparent glass substrate in the same manner as in Example 4 to obtain the substrate which was dyed in blue all over the surface thereof.

A photoresist was then formed on the portions other than the portions on which the black mask was to be formed and simultaneously the dye on the portions, which were not covered with the photoresist, of the alumina layer was decolored.

Next, the substrate was immersed in a solution of palladium-tin catalyst for 1 minute and then the resist was removed. Subsequently, the substrate was immersed in a 3%-aqueous solution of NaOH to activate the catalyst.

Next, the substrate was immersed in a nickel-plating bath at 80° C. for 1 minute to obtain the black mask formed by the Ni-plating.

Next, the dyeing processes in R and G were conducted in the same manner as in Example 4 and a thermosetting melamine resin was coated in a thickness of 0.5 to 1.0 μm to form the overcoat layer, whereby finishing the color filter.

Example 6

An alumina layer 5 to 10 μm thick was formed on the transparent glass substrate 1.1 mm thick by the sol-gel method.

The substrate was then immersed in a bath of a red dye C.I. Acid Red 9 at about 60° C. for about 10 minutes to dye the alumina layer in red all over the surface thereof and then washed followed by drying.

Next, A photoresist was spin-coated and the pattern of the black mask was exposed and developed to form the photoresist on the portions other than the portions on which the black mask was to be formed and simultaneously the red dye on the portions, which had not been covered with the photoresist, of the alumina layer was decolored.

Subsequently, the black mask was formed by the chemical plating in the same manner as in Example 2 and the photoresist was removed.

A photoresist was then spin-coated and the pattern of the second color, that is a green color, was exposed and developed to form the photoresist on the portions other than the portions which were to be dyed in green and simultaneously the red dye of the portions, which had not been covered with the photoresist, of the alumina layer was decolored.

Successively, the substrate was immersed in a bath of a green dye C.I. Acid Green 41 at about 40° C. for about 10 minutes to dye the portions, which had been decolored, of the alumina layer in green and then washed and dried followed by removing the photoresist with acetone.

An photoresist was spin-coated and the pattern of the third color, that is a blue color, was exposed and developed to form the photoresist on the portions other than the portions which were to be dyed in blue and simultaneously the red dye on the portions, which had not been covered with the photoresist, of the alumina layer was decolored.

The substrate was then immersed in a bath of blue dye C.I. Acid Blue 112 at about 60° C. for about 10 minutes to dye the portions, which had been decolored, of the alumina layer in blue and then washed followed by drying.

Next, after the photoresist was removed with acetone, a thermosetting melamine resin was coated in a thickness of 0.5 to 1.0 μm to form the overcoat layer, whereby finishing the color filter with the black mask formed by the chemical plating.

Example 7

A photoresist was formed on the portions other than the portions, on which the black mask was to be formed, in the same manner as in Example 6 and simultaneously the dye of the portions other than the portions, on which the photoresist had been formed, was decolored.

The black mask was then formed by Ni-plating in the same manner as in Example 5.

Next, the treatment was conducted in the same manner as in Example 6 to obtain the color filter.

Example 8

The treatment was conducted in the same manner as in Example 7 excepting that the black mask was formed with black dye in place of Ni-plating to obtain the color filter.

INDUSTRIAL APPLICABILITY

According to the present invention, the color filter used in a liquid crystal television and other color displays can be efficiently produced.

We claim:

1. A method of producing a color filter, which comprises the following steps conducted in turn:
   (a) a step of forming an inorganic active layer on a transparent substrate;
   (b) a step of dyeing said inorganic active layer in a first color;
   (c) a step of forming a resist on portions of said inorganic active layer other than portions which are to be dyed in a second color;
   (d) a step of conducting a decoloring treatment to decolor exposed portions of said inorganic active layer;
   (e) a step of dyeing said exposed portions of said inorganic active layer in the second color;
   (f) a step of removing said resist;
   (g) a step of forming a resist on portions of said inorganic active layer other than portions which are to be dyed in a third color;
   (h) a step of conducting a decoloring treatment to decolor exposed portions of said inorganic active layer;
   (i) a step of dyeing said exposed portions of said inorganic active layer in the third color; and
   (j) a step of removing said resist.

2. A method of producing a color filter, which comprises the following steps conducted in turn:
   (a) a step of forming an inorganic active layer on a transparent substrate;
   (b) a step of dyeing said inorganic active layer in a first color;
   (c) a step of forming a resist on portions of said inorganic active layer other than portions which are to be dyed in a second color;
   (d) a step of conducting a decoloring treatment to decolor exposed portions of said inorganic active layer;
   (e) a step of dyeing said exposed portions of said inorganic active layer in the second color;
   (f) a step of removing said resist;
   (g) a step of forming a resist on portions of said inorganic active layer other than portions which are to be dyed in a third color;
   (h) a step of conducting a decoloring treatment to decolor exposed portions of said inorganic active layer;
   (i) a step of dyeing said exposed portions of said inorganic active layer in the third color;
   (j) a step of removing said resist;
   (k) a step of forming a resist on portions of said inorganic active layer other than portions on which a black mask is to be formed;
   (l) a step of forming the black mask on gaps among the portions, which have been dyed in the first to third colors, by chemical plating; and
   (m) a step of removing said resist.

3. A method of producing a color filter, which comprises the following steps conducted in turn:
   (a) a step of forming an inorganic active layer on a transparent substrate;
   (b) a step of dyeing said inorganic active layer in a first color;
   (c) a step of forming a resist on portions of said inorganic active layer other than portions which are to be dyed in a second color;
   (d) a step of conducting a decoloring treatment to decolor exposed portions of said inorganic active layer;
   (e) a step of dyeing said exposed portions of said inorganic active layer in the second color;
   (f) a step of removing said resist;
   (g) a step of forming a resist on portions of said inorganic active layer other than portions which are to be dyed in a third color;
   (h) a step of conducting a decoloring treatment to decolor exposed portions of said inorganic active layer;

(i) a step of dyeing said exposed portions of said inorganic active layer in the third color;
(j) a step of removing said resist;
(k) a step of forming a resist on portions of said inorganic active layer other than portions on which a black mask is to be formed;
(l) a step of dyeing between the portions, which have been dyed in the first to third colors, in black to form the black mask; and
(m) a step of removing said resist.

4. A method of producing a color filter, which comprises the following steps conducted in turn:
(a) a step of forming an inorganic active layer on a transparent substrate;
(b) a step of dyeing said inorganic active layer in a first color;
(c) a step of forming a resist on portions of said inorganic active layer other than portions on which a black mask is to be formed;
(d) a step of conducting a decoloring treatment to decolor exposed portions of said inorganic active layer;
(e) a step of forming the black mask by chemical plating or dyeing in black;
(f) a step of removing said resist;
(g) a step of forming a resist on portions of said inorganic active layer other than portions which are to be dyed in a second color;
(h) a step of conducting a decoloring treatment to decolor exposed portions of said inorganic active layer;
(i) a step of dyeing said exposed portions of said inorganic active layer in the third color;
(j) a step of removing said resist;
(k) a step of forming a resist on portions of said inorganic active layer other than portions which are to be dyed in a third color;
(l) a step of conducting a decoloring treatment to decolor exposed portions of said inorganic active layer;
(m) a step of dyeing said exposed portions of said inorganic active layer in the third color; and
(n) a step of removing said resist.

5. A method of producing a color filter, which comprises the following steps conducted in turn:
(a) a step forming an inorganic active layer on a transparent substrate;
(b) a step of dyeing said inorganic active layer in a first color;
(c) a step of forming a resist on portions of said inorganic active layer other than portions on which a black mask is to be formed;
(d) a step of conducting a decoloring treatment to decolor exposed portions of said inorganic active layer;
(e) a step of absorbing a catalyst solution into the inorganic active layer;
(f) a step of removing said resist;
(g) a step of activating said catalyst solution;
(h) a step of forming a black mask by plating metal;
(i) a step of forming a resist on portions of said inorganic active layer other than portions which are to be dyed in a second color;
(j) a step of conducting a decoloring treatment to decolor exposed portions of said inorganic active layer;
(k) a step of dyeing said exposed portions of said inorganic active layer in the second color;
(l) a step of removing said resist;
(m) a step of forming a resist on portions of said inorganic active layer other than portions which are to be dyed in a third color;
(n) a step of conducting a decoloring treatment to decolor exposed portions of said inorganic active layer;
(o) a step of dyeing said exposed portions of said inorganic active layer in a third color; and
(p) a step of removing said resist.

6. A method of producing a color filter, which comprises the following steps conducted in turn:
(a) a step of forming an inorganic active layer on a transparent substrate;
(b) a step of dyeing said inorganic active layer in a first color;
(c) a step of forming a photoresist on portions of said inorganic active layer other than portions on which a black mask is to be formed and simultaneously decoloring portions of said inorganic active layer other than the portions on which said photoresist has been formed;
(d) a step of forming the black mask by chemical plating;
(e) a step of removing the photoresist;
(f) a step of forming a photoresist on portions of said inorganic active layer other than portions which are to be dyed in a second color and simultaneously decoloring portions of said inorganic active layer other than the portions on which said photoresist has been formed;
(g) a step of dyeing the decolored portions of said inorganic active layer in the second color;
(h) a step of removing the photoresist;
(i) a step of forming a photoresist on portions of said inorganic active layer other than portions which are to be dyed in a third color and simultaneously decoloring portions other than the portions on which said photoresist has been formed;
(j) a step of dyeing the decolored portions of said inorganic active layer in the third color; and
(k) a step of removing the photoresist.

7. A method of producing a color filter, which comprises the following steps conducted in turn:
(a) a step of forming an inorganic active layer on a transparent substrate;
(b) a step of dyeing said inorganic active layer in a first color;
(c) a step of forming a photoresist on portions of said inorganic active layer other than portions on which a black mask is to be formed and simultaneously decoloring portions of said inorganic active layer other than the portions on which said photoresist has been formed;
(d) a step of absorbing a catalyst solution into the inorganic active layer;
(e) a step of removing the photoresist;
(f) a step of activating said catalyst solution;
(g) a step of forming said black mask by plating metal;
(h) a step of forming a photoresist on portions of said inorganic active layer other than portions which are to be dyed in a second color and simultaneously decoloring portions of said inorganic active layer other than the portions on which said photoresist has been formed;
(i) a step of dyeing the decolored portions of said inorganic active layer in the second color;
(j) a step of removing the photoresist;

(k) a step of forming a photoresist on portions of said inorganic active layer other than portions which are to be dyed in a third color and simultaneously decoloring portions of said inorganic active layer other than the portions on which said photoresist has been formed;

(l) a step of dyeing the decolored portions of said inorganic active layer in the third color; and (m) a step of removing the photoresist.

8. A method of producing a color filter, which comprises the following steps conducted in turn:

(a) a step of forming an inorganic active layer on a transparent substrate;

(b) a step of dyeing said inorganic active layer in a first color;

(c) a step of forming a photoresist on portions of said inorganic active layer other than portions on which a black mask is to be formed and simultaneously decoloring portions other than the portions on which said photoresist has been formed;

(d) a step of forming said black mask by dyeing the inorganic active layer in black;

(e) a step of removing the photoresist;

(f) a step of forming a photoresist on portions of said inorganic active layer other than portions which are to be dyed in a second color and simultaneously decoloring portions of said inorganic active layer other than the portions on which said photoresist has been formed;

(g) a step of dyeing the decolored portions of said inorganic active layer in the second color;

(h) a step of removing the photoresist;

(i) a step of forming a photoresist on portions of said inorganic active layer other than portions which are to be dyed in a third color and simultaneously decoloring portions of said inorganic active layer other than the portions on which said photoresist has been formed;

(j) a step of dyeing the decolored portions of said inorganic active layer in the third color; and (k) a step of removing the photoresist.

9. The method according to any one of claims 1 to 8, wherein said inorganic active layer is obtained by applying a sol, which is obtained by electrolyzing an aqueous solution of a compound expressed by the following general formula (I) and degelatinizing the electrolyzed solution, to said transparent substrate and baking the applied sol, $$M(OR_1)_m(OR_2)_nX_pY_q \qquad (I)$$

wherein M is at least one element selected form the group consisting of magnesium, calcium, zirconium, titanium, hafnium, germanium, yttrium, aluminum, gallium, tin and silicon; $R_1$ and $R_2$, which are the same or different, show a hydrogen atom, an alkyl group or an acyl group, respectively; X and Y, which are the same or different, show a hydrogen atom, a chlorine atom or a hydroxyl group, respectively; m, n, p and q are an integer of 0 to 8, respectively, so as to meet $m+n+p+q=$ a valence of M.

* * * * *

UNITED STATES PATENT AND TRADEMARK OFFICE
CERTIFICATE OF CORRECTION

PATENT NO. : 5,320,920
DATED : June 14, 1994
INVENTOR(S) : Tenri Isoda et al

It is certified that error appears in the above-indentified patent and that said Letters Patent is hereby corrected as shown below:

On the title page, correct the name of the 5th inventor to read --Keiji Kishi--.

Signed and Sealed this

Twenty-fifth Day of October, 1994

Attest:

BRUCE LEHMAN

*Attesting Officer*     *Commissioner of Patents and Trademarks*